United States Patent [19]
Iijima et al.

[11] Patent Number: 5,886,558
[45] Date of Patent: *Mar. 23, 1999

[54] SEMICONDUCTOR UNIT

[75] Inventors: Hiroaki Iijima, Ota; Fumihiro Dasai, Oisumi-machi; Tsutomu Fujino, Ota, all of Japan

[73] Assignee: Sanyo Electric Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 703,884

[22] Filed: Aug. 27, 1996

[30] Foreign Application Priority Data

| | | | |
|---|---|---|---|
| Aug. 31, 1995 | [JP] | Japan | 7-224381 |
| Oct. 16, 1995 | [JP] | Japan | 7-267097 |
| May 29, 1996 | [JP] | Japan | 8-135372 |

[51] Int. Cl.$^6$ ..................................................... H03K 5/08
[52] U.S. Cl. ......................... 327/310; 327/312; 327/313; 327/314; 327/320; 327/546
[58] Field of Search ............................ 327/310, 312–314, 327/319–320, 545–546

[56] References Cited

U.S. PATENT DOCUMENTS

| | | | |
|---|---|---|---|
| 4,847,518 | 7/1989 | Leidich | 327/315 |
| 4,958,132 | 9/1990 | Plants | 327/312 |
| 5,272,399 | 12/1993 | Tihanyi et al. | 327/312 |
| 5,280,200 | 1/1994 | Tarng | 327/312 |
| 5,440,163 | 8/1995 | Ohhashi | 257/355 |
| 5,486,716 | 1/1996 | Saito et al. | 257/360 |
| 5,574,395 | 11/1996 | Kusakabe | 327/314 |
| 5,610,550 | 3/1997 | Furutani | 327/541 |

FOREIGN PATENT DOCUMENTS

| | | | |
|---|---|---|---|
| 354147768 | 11/1979 | Japan | 327/314 |
| 48115 | 1/1992 | Japan . | |
| 405055839 | 3/1993 | Japan | 327/314 |

OTHER PUBLICATIONS

IBM Tech Disc Bul., vol. 38, No. 12 327/314, Protect diode scheme for chips requiring isolated power/ground planes for internal/external noise isolation, Dec. 1995.

*Primary Examiner*—Margaret Rose Wambach
*Attorney, Agent, or Firm*—Lorusso & Loud

[57] ABSTRACT

A semiconductor unit is composed of an analog unit, a digital unit, a signal line through which a signal is transmitted from the analog unit to the digital unit, an electric source line Vdd1 through which a high voltage is applied to the analog unit, an electric source line Vdd2 through which the high voltage is applied to the digital unit, an electric source line Vss1 through which a low voltage is applied to the analog unit, an electric source line Vss2 through which the low voltage is applied to the digital unit, and a protective circuit arranged between the electric source lines Vss1 and Vss2. The protective circuit functions to electrically connect the electric source line Vss1 and the electric source line Vss2 in cases where an electric potential difference between the electric source lines Vss1 and Vss2 exceeds a prescribed value. Similar protection can be provided between the high voltage source lines Vdd1 and Vdd2 or between the signal line and the second source lines Vdd2 and Vss2.

In a semiconductor unit having a lengthy section of an electric source line connected between first and second circuits, a protective circuit short cuts the lengthy section of the electric source line.

24 Claims, 16 Drawing Sheets

SEMICONDUCTOR UNIT

BACKGROUND OF THE INVENTION

1. Field of the Invention

The present invention relates generally to a semiconductor unit having two or more types of electric source systems.

2. Description of the Prior Art

Hereinafter, a conventional semiconductor unit is described with reference to drawings. There are many types of semiconductor units which have two or more types of electric source systems separated from each other. As a representative unit, a semiconductor unit having a digital section and an analog section is known. In general, voltages applied by the different electric source systems in one semiconductor unit differ from each other. However, in at least one case the voltages applied by the different electric source systems in one semiconductor unit are the same.

An example of a conventional semiconductor unit shown in FIG. 1 has an analog section as a first circuit and a digital section as a second circuit. The analog section includes an analog circuit 1, an output circuit 3 and an input protective circuit 5. The digital section includes a digital circuit 2 and an input circuit 4. The first and second circuits are connected with each other through a signal line S1 between the output circuit 3 and the input circuit 4 of the respective first and second circuits.

An electric source voltage applied to the analog section is supplied through electric source lines Vdd1 and Vss1, and an electric source voltage applied to the digital section is supplied through electric source lines Vdd2 and Vss2. The electric source line Vdd1 is separated from the electric source line Vdd2, and the electric source line Vss1 is separated from the electric source line Vss2.

In the above configuration, a signal is output from the analog circuit 1 through the output circuit 3 to the digital section. Thereafter, the signal is input to the input circuit 4, an inverter, through the signal line S1 and is transmitted to the digital circuit 2.

Also, another conventional semiconductor unit shown in FIG. 2 has an analog section composed of an analog circuit 11, an output circuit 13 and an input protective circuit 15 and a digital section composed of a digital circuit 12 and an input circuit 14. The first and second circuits are connected with each other through a signal line S1. An electric source voltage applied to the analog section is supplied through electric source lines Vdd and Vss, and an electric source voltage applied to the digital section is supplied through the same electric source lines Vdd and Vss. In the above configuration, the path for the electric source line Vss takes a long way around because of a design requirement and the electric source line Vss becomes lengthy.

In these prior art circuits, certain surges applied to input terminals NT or to a low potential side terminal Vss1 or Vss cause semiconductor units to fail in spite of the protection provided by the input protection circuit 5 or 15.

SUMMARY OF THE INVENTION

An object of the present invention is to provide, with due consideration to the drawbacks of such a conventional semiconductor unit, a semiconductor unit in which break down of an element caused by an electric potential difference between two electric source systems is suppressed.

It has been discovered in the unit of FIG. 1 that when certain surges are input to an applied terminal NT and passed by the protective circuit 5 of the analog section because of some reason, a surge current SR passing through a route shown in FIG. 1 is generated and an electric potential of the electric source line Vss1 is increased. An electric potential of the signal line S1 is also increased with the increase of the electric source line Vss1. Similarly when a surge is undesirably input to the electric source line Vss1 and passed by the protective circuit 5, an electric potential of the signal line S1 is increased. Therefore, a gate electric potential of a metal-oxide-semiconductor (MOS) transistor Q1 in the inverter of the input circuit 4 is excessively increased to increase a voltage between a gate and a source of the MOS transistor Q1 excessively increased. This increased voltage breaks down a gate oxide film of the MOS transistor Q1.

In the present invention, a semiconductor unit comprises a first circuit, a second circuit, a signal line, and a protective circuit for electrically connecting a first electric source line of a low electric potential side (or a high electric potential side) and a second electric source line of a low electric potential side (or a high electric potential side) in cases where an electric potential difference between the first electric source line of the low electric potential side (or the high electric potential side) and the second electric source line of the low electric potential side (or the high electric potential side) exceeds a prescribed value. Therefore, even though an electric potential difference between the first electric source line of the low electric potential side (or the high electric potential side) and the second electric source line of the low electric potential side (or the high electric potential side) is induced to become large because of some reason such as a surge input, when the electric potential difference exceeds a prescribed electric potential difference, the protective circuit electrically connects the first electric source line of the low electric potential side (or the high electric potential side) and the second electric source line of the low electric potential side (or the high electric potential side), so that the electric potential of the first electric source line of the low electric potential side (or the high electric potential side) becomes equal to that of the second electric source line of the low electric potential side (or the high electric potential side).

Accordingly, though an electric potential of a signal line is increased with the increase of a surge current and a gate electric potential of a MOS transistor in an input circuit of a digital unit is excessively increased to break down a gate of the MOS transistor in the prior art, the gate break down can be prevented in the present invention.

Also, another semiconductor unit according to the present invention comprises a first circuit, a second circuit, a signal line, and a protective circuit for electrically connecting the signal line and an electric source line of a low electric potential side (or a high electric potential side) in cases where an electric potential difference between the signal line and the electric source line of the low electric potential side (or the high electric potential side) exceeds a prescribed value.

In the above configuration, even though an electric potential difference between the signal line and the electric source line of the low electric potential side (or the high electric potential side) is induced to become large because of some reason such as a surge input, when the electric potential difference exceeds a prescribed electric potential difference, the protective circuit electrically connects the signal line and the electric source line of the low electric potential side (or the high electric potential side), so that the electric potential of the electric source line of the low electric potential side (or the high electric potential side) becomes equal to that of the signal line.

Accordingly, though an electric potential of a signal line is increased with the increase of a surge current and a gate electric potential of a MOS transistor in an input circuit of a digital unit is excessively increased to break down a gate of the MOS transistor in the prior art, the gate break down can be prevented in the present invention.

Also, even though a large amount of current is induced to pass through the signal line in an abnormal operation, because the protective circuit is provided for the semiconductor unit, the current is split by the protective circuit, and a major part of the current passes through the electric source line of the low electric potential side (or the high electric potential side). Therefore, because any large amount of current does not pass through the signal line, break down of input and output circuits connected to the signal line can be prevented.

In respect to the prior art circuit of FIG. 2, it has been discovered that a surge in an electric potential when electric power is applied to the electric source line Vss close to the analog circuit 11 is delayed in reaching the digital circuit 12 due to the lengthy section of the line Vss between the analog and digital circuits. Thus a voltage increase in the signal line S1 produced by the surge reaches the digital circuit 12 before the voltage increase in the line Vss because the transmission of the electric power to the digital section is delayed by the lengthy electric source line Vss. In this case, a large electric potential difference instantaneously occurs across the input of the digital circuit 12 and a gate insulating film of a MOS transistor of an inverter in the input circuit 14 in a front stage of the digital circuit 12 is broken down.

In accordance with a second aspect of the present invention, a protective circuit is provided across a lengthy section of an electric source line between first and second circuits so as to short cut the lengthy section when an electric potential across the lengthy section exceeds a prescribed value.

DESCRIPTION OF THE PREFERRED EMBODIMENTS

Preferred embodiments of a semiconductor unit according to the present invention are described with reference to drawings.

(1) First Embodiment

Figure 1:
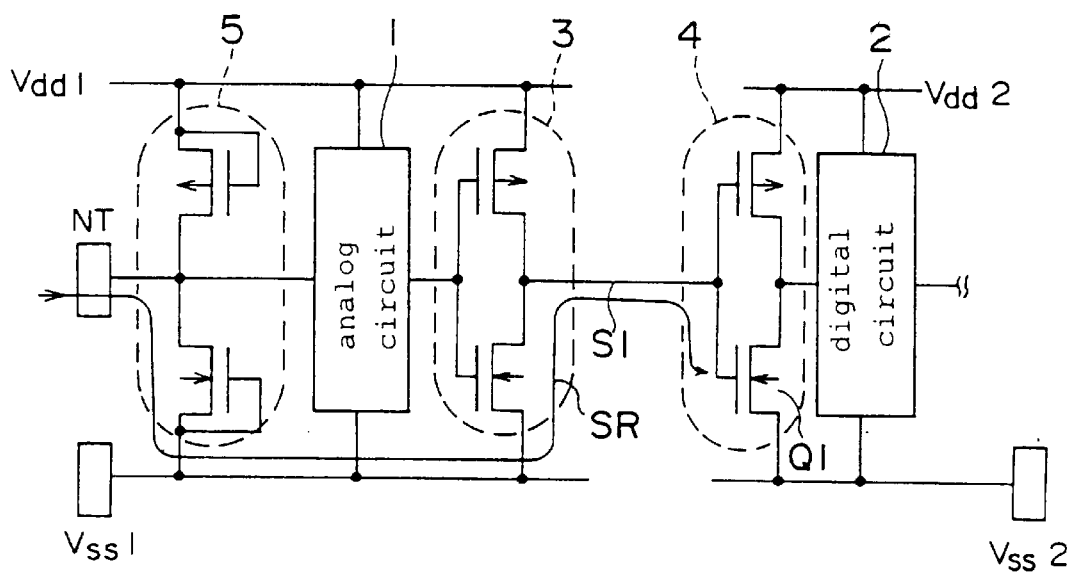
FIG. 1 is an electrical diagram of a conventional semiconductor unit.
Figure 2:
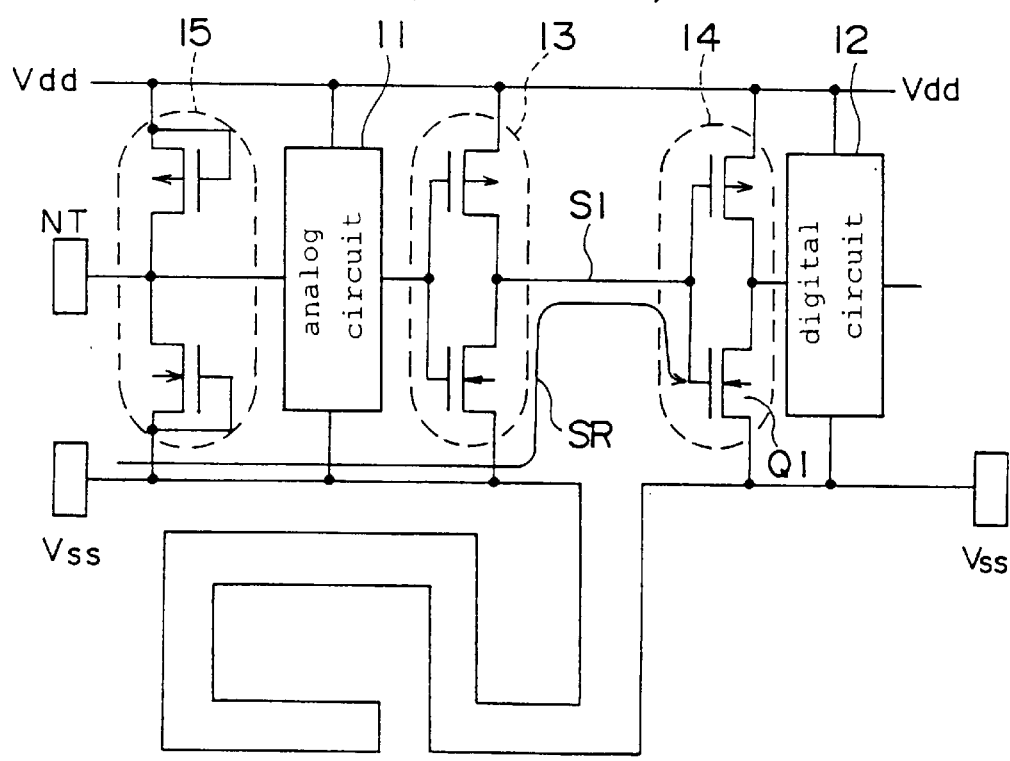
FIG. 2 is an electrical diagram of another conventional semiconductor unit.
Figure 3:
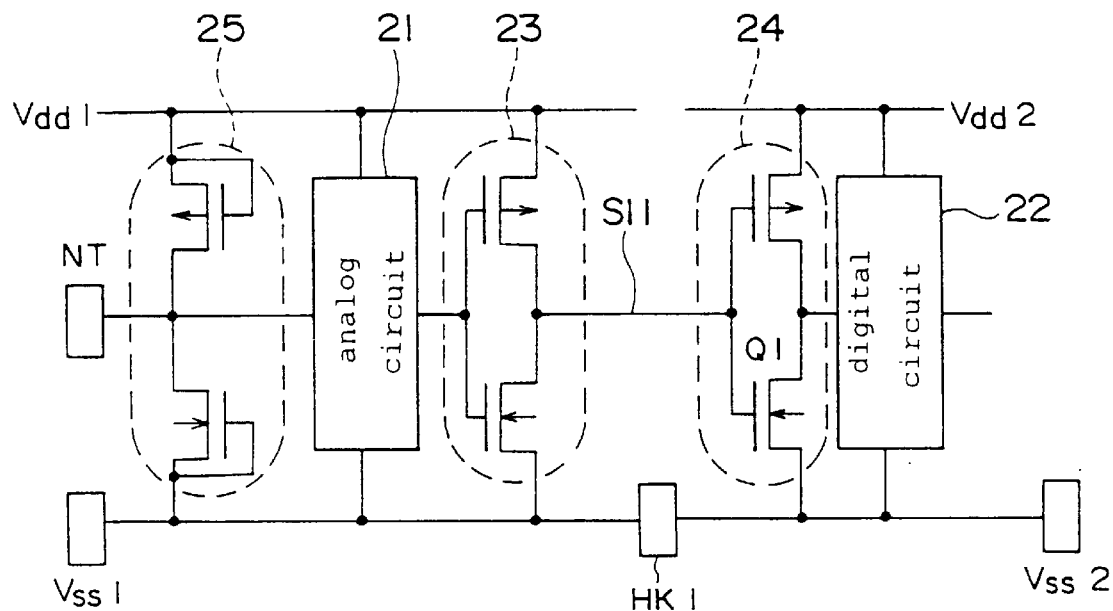
FIG. 3 is an electrical diagram of a semiconductor unit according to a first embodiment of the present invention.

As shown in FIG. 3, a semiconductor unit according to the first embodiment comprises a digital unit and an analog unit in the same manner as a semiconductor memory or the like. The analog unit comprises an analog circuit 21, an output circuit 23 and an input protective circuit 25. The digital unit comprises a digital circuit 22 and an input circuit 24. The analog unit and the digital unit are connected with each other through a signal line S11.

An electric source voltage applied to the analog unit is supplied through each of electric source lines Vdd1 and Vss1, and an electric source voltage applied to the digital unit is supplied through each of electric source lines Vdd2 and Vss2. The electric source line Vdd1 is separated from the electric source line Vdd2, and the electric source line Vss1 and the electric source line Vss2 are connected to each other through a protective circuit HK1.

The analog unit is an example of a first circuit, and the digital unit is an example of a second circuit. Also, the electric source line Vdd1 is an example of a first electric source line of a high electric potential side, the electric source line Vss1 is an example of a first electric source line of a low electric potential side, the electric source line Vdd2 is an example of a second electric source line of a high electric potential side, and the electric source line Vss2 is an example of a second electric source line of a low electric potential side. Alternatively, a digital circuit can be the first circuit and an analog circuit can be the second circuit. As other alternatives digital circuits can be the first and second circuits or analog circuits can be the first and second circuits.

The protective circuit HK1 functions to electrically connect the electric source line Vss1 and the electric source line Vss2 in cases where an electric potential difference between the electric source lines Vss1 and Vss2 exceeds a prescribed value. That is, the protective circuit HK1 is a switching circuit which, when operated, sets the electric source lines Vss1 and Vss2 to the same electric potential.

In the above configuration, a signal generated in the analog circuit 21 is output to the signal line S11 through the output circuit 23 and is transmitted to the digital circuit 22 through the input circuit 24 made of an inverter. In this case, when a surge is input to either an applied terminal NT used as an input terminal of the analog unit or the electric source terminal Vss1, an electric potential difference between the electric source lines Vss1 and Vss2 is induced to become large. However, when the electric potential difference exceeds a prescribed electric potential difference, the protective circuit HK1 is operated, the electric source lines Vss1 and Vss2 are electrically connected to each other, and the electric source lines Vss1 and Vss2 are set to the same electric potential.

Accordingly, there is prevented an electric potential of the signal line S11 increasing with the increase of an electric potential of the electric source lines Vss1 and a gate electric potential of a MOS transistor Q1 in the input circuit 24 of the digital unit excessively increasing to break down a gate of the MOS transistor Q1 in the same manner as in the prior art.

Figure 4:
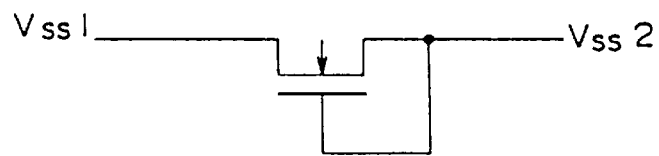
FIG. 4 is a diagram of a first type of protective circuit (HK1 or HK2) according to the first embodiment of the present invention.
Figure 5:
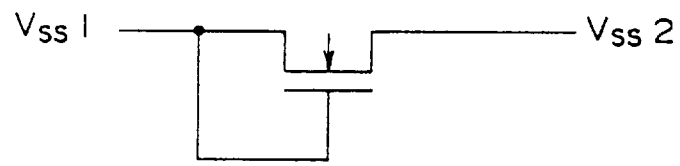
FIG. 5 is a diagram of a second type of protective circuit (HK1 or HK2) according to the first embodiment of the present invention.
Figure 6:
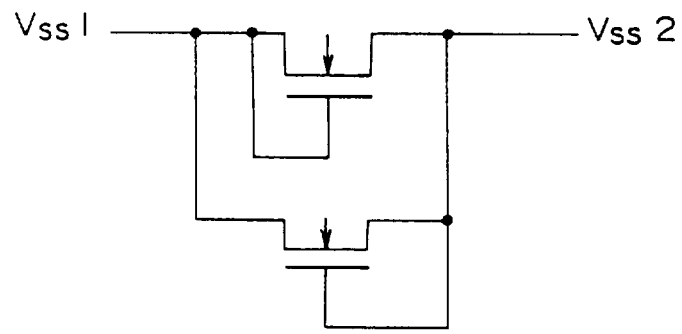
FIG. 6 is a diagram of a third type of protective circuit (HK1 or HK2) according to the first embodiment of the present invention.
Figure 7:
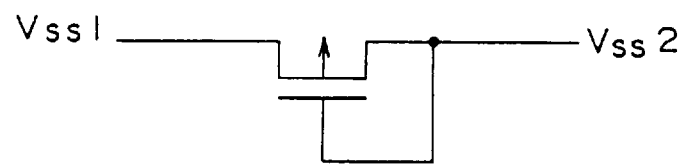
FIG. 7 is a diagram of a fourth type of protective circuit (HK1 or HK2) according to the first embodiment of the present invention.
Figure 8:
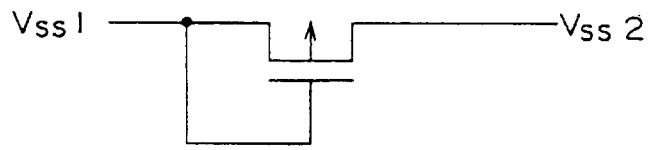
FIG. 8 is a diagram of a fifth type of protective circuit (HK1 or HK2) according to the first embodiment of the present invention.
Figure 9:
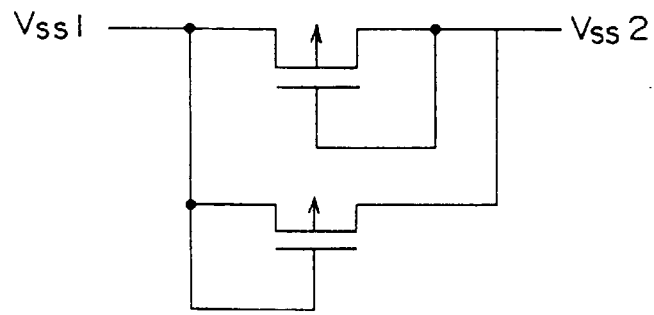
FIG. 9 is a diagram of a sixth type of protective circuit (HK1 or HK2) according to the first embodiment of the present invention.
Figure 10:
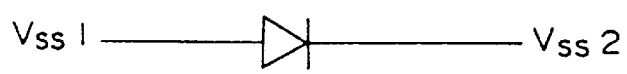
FIG. 10 is a diagram of a seventh type of protective circuit (HK1 or HK2) according to the first embodiment of the present invention.
Figure 11:
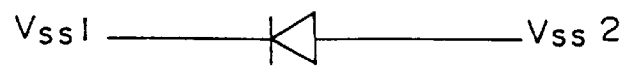
FIG. 11 is a diagram of an eighth type of protective circuit (HK1 or HK2) according to the first embodiment of the present invention.
Figure 12:
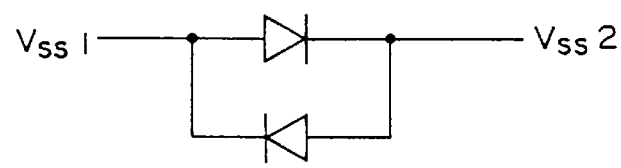
FIG. 12 is a diagram of a ninth type of protective circuit (HK1 or HK2) according to the first embodiment of the present invention.

Actual examples of the protective circuit HK1 are shown in FIGS. 4 to 12. The protective circuit HK1 shown in FIGS. 4 to 6 is one or more n-channel MOS transistors, the protective circuit HK1 shown in FIGS. 7 to 9 is one or more p-channel MOS transistors, and the protective circuit HK1 shown in FIGS. 10 to 12 is one or more diodes. In each of the examples of the protective circuit HK1, the electric source line Vss1 and the electric source line Vss2 are electrically connected to each other in cases where an electric potential difference between the electric source lines Vss1 and Vss2 exceeds a prescribed value, so that the electric source lines Vss1 and Vss2 are held to almost the same electric potential.

The configuration of the protective circuit HK1 is not limited to the examples shown in FIGS. 4 to 12. For example, the protective circuit HK1 can be made by connecting two or more examples in series or in parallel. Also, the protective circuit HK1 can be composed of one or more bipolar transistors such as PNP type transistors or NPN transistors. In conclusion, any circuit can be used as the protective circuit HK1 on condition that two electric source lines are electrically connected to set the two electric source lines to the same electric potential in cases where an electric potential difference between the two electric source lines exceeds a prescribed value.

The protective circuit HK1 shown in FIG. 10 is described as an example. The protective circuit HK1 is composed of a single diode. In this circuit, when an electric potential difference between the electric source lines Vss1 and Vss2 is equal to or lower than about 0.6 V, the electric source lines Vss1 and Vss2 are not electrically connected to each other. However, in cases where an electric potential of the electric source line Vss1 is increased because of some reason and an electric potential difference between the electric source lines Vss1 and Vss2 becomes higher than 0.6 V, the diode is turned on, the electric source lines Vss1 and Vss2 are electrically connected to each other, and the electric source lines Vss1 and Vss2 are set to almost the same electric potential, i.e., a difference less than about 0.6 V. Also, even though a comparatively high opposite-directional voltage occurs between the electric source lines Vss1 and Vss2 as an electric potential difference, the electric source lines Vss1 and Vss2 are set to almost the same electric potential because of the breakdown of the diode. In each of the other examples of the protective circuit HK where an electric potential difference between the electric source lines Vss1 and Vss2 becomes higher than a prescribed value, the electric source lines Vss1 and Vss2 are electrically connected to each other, and the electric source lines Vss1 and Vss2 are set to almost the same electric potential in the same manner.

Figure 13:
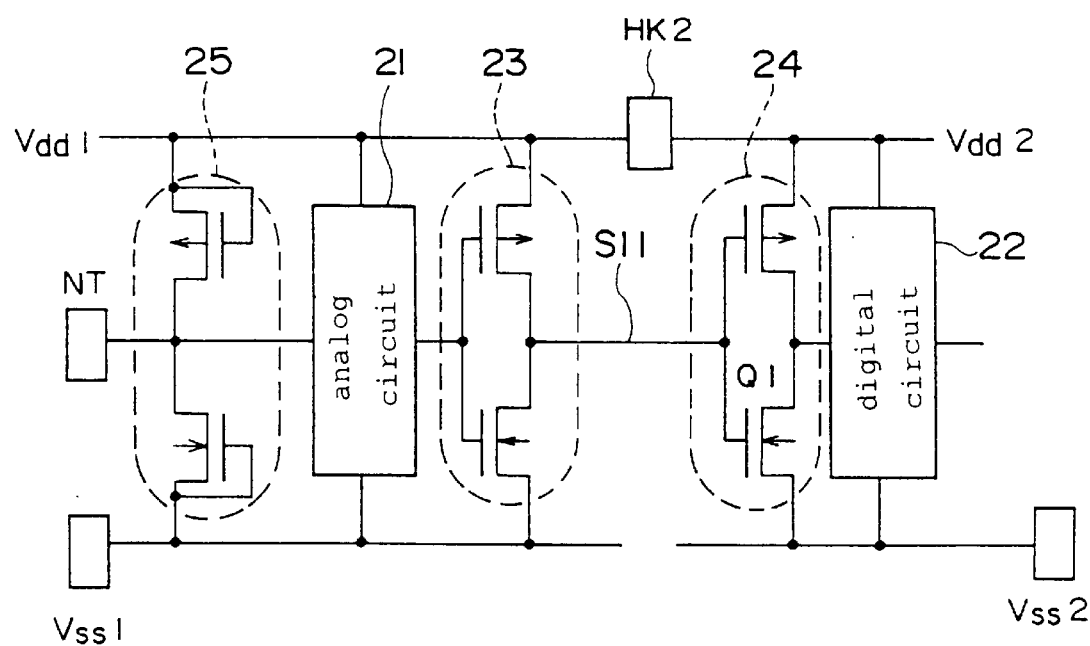
FIG. 13 is a diagram of a second variation of the semiconductor unit according to the first embodiment of the present invention.
Figure 14:
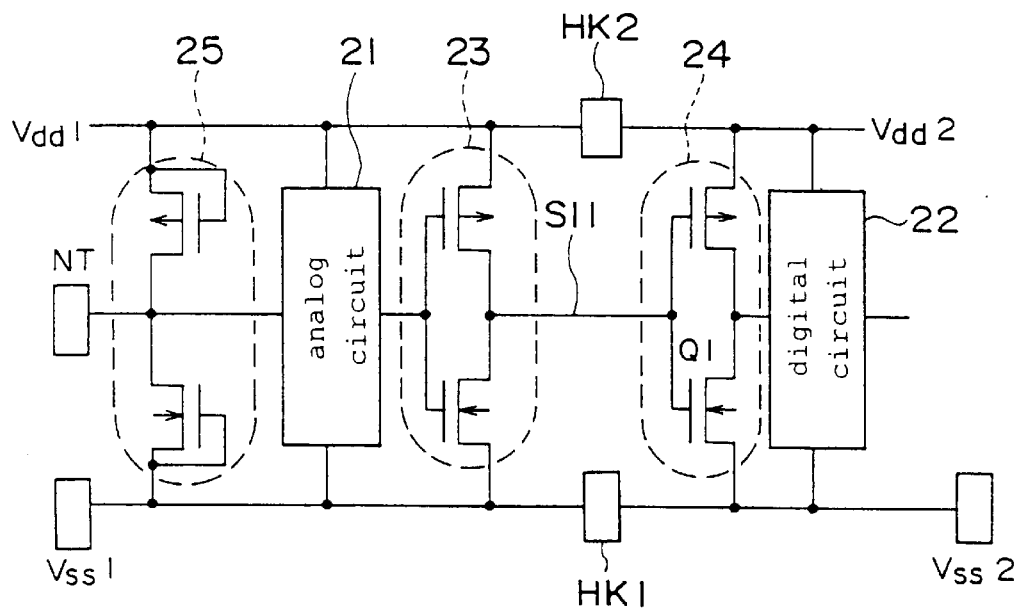
FIG. 14 is a diagram of a third variation of the semiconductor unit according to the first embodiment of the present invention.

In the first embodiment, the protective circuit HK1 is arranged between the electric source lines Vss1 and Vss2 of the low electric potential side. However, the present invention is not limited to the protective circuit HK1. That is, as shown in FIG. 13, a protective circuit HK2 can be arranged between the electric source lines Vdd1 and Vdd2 of the high electric potential side. Also, as shown in FIG. 14, the protective circuit HK1 can be arranged between the electric source lines Vss1 and Vss2 of the low electric potential side and the protective circuit HK2 can be arranged between the electric source lines Vdd1 and Vdd2 of the high electric potential side be provided for the semiconductor unit.

(2) Second Embodiment

Hereinafter, a semiconductor unit according to a second embodiment of the present invention is described. The same matters as those in the first embodiment are omitted to avoid duplicated description.

Figure 15:
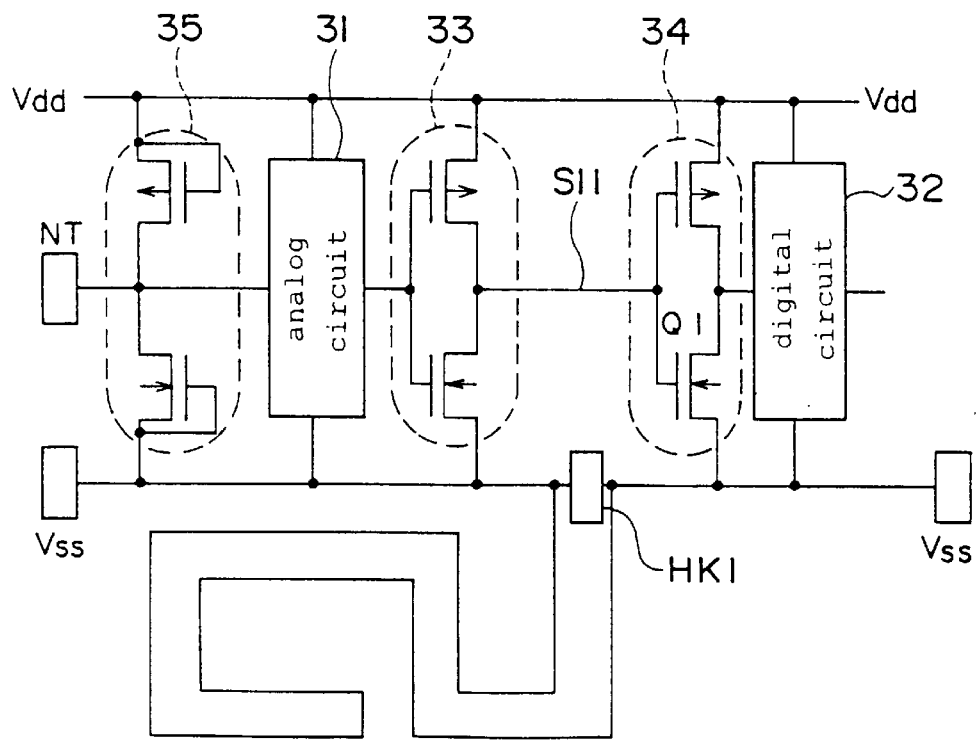
FIG. 15 is an electrical diagram of a semiconductor unit according to a second embodiment of the present invention.

As shown in FIG. 15, a semiconductor unit comprises an analog unit and a digital unit. The analog unit comprises an analog circuit 31, an input protective circuit 35 connected to the analog circuit 31, and an output circuit 33 connected to the analog circuit 31. The digital unit comprises a digital circuit 32 and an input circuit 34 connected to the digital circuit 32. An electric source line Vss of a low electric potential side and an electric source line Vdd of a high electric potential side are connected to the circuits 31 to 35, and a signal line S11 connects the output circuit 33 and the input circuit 34. The electric source line Vss takes a long way around another section (not shown) because of a design requirement, so that the electric source line Vss between the analog and digital units becomes lengthy. The protective circuit HK1 is connected across this lengthy section of the electric source line Vss between the analog unit and the digital unit to short-cut the electric source line Vss.

In the above configuration, a signal generated in the analog circuit 31 is output to the signal line S11 through the output circuit 33 and is transmitted to the digital circuit 32 through the input circuit 34 made of an inverter.

In the absence of the protective circuit HK1 when an electric power is supplied to the electric source line Vss placed in the analog unit, a surge voltage is input to the electric source line Vss in an electric power supply starting operation and the transmission of the electric power to the digital unit is delayed by the lengthy electric source line Vss causing a large electric potential difference to instantaneously occur between the portion of the electric source line Vss close to the analog circuit 31 and the portion of the electric source line Vss close to the digital circuit 32. Thus the electric potential of the signal line S11 is excessively increased, and a gate insulating film of a MOS transistor Q1 of an inverter in the input circuit 34 of the digital circuit 32 is undesirably broken down.

However in the presence of the protective circuit HK1, an electric potential difference instantaneously occurring between the portion of the electric source line Vss close to the analog circuit 31 and the portion of the electric source line Vss close to the digital circuit 32 and exceeding a prescribed electric potential difference operates the protective circuit HK1 to short-cut the lengthy portion of the electric source line Vss between the analog and digital circuits, so that an electric potential of the portion of the electric source line Vss close to the digital circuit 32 is rapidly increased to the prescribed electric source voltage. Therefore, the break down of the gate insulating film of the MOS transistor Q1 can be prevented.

Figure 16:
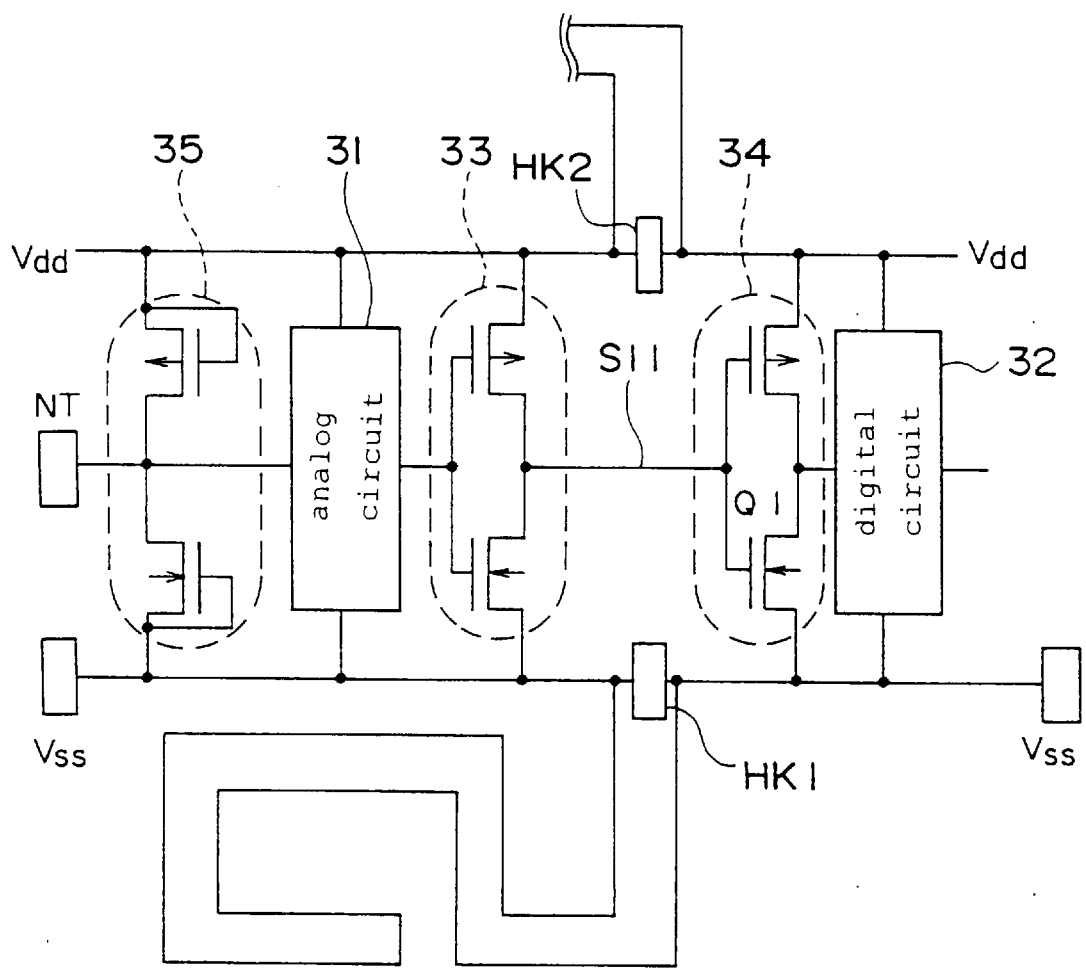
FIG. 16 is a diagram of a second variation of the semiconductor unit according to the second embodiment of the present invention.

In the second embodiment of FIG. 15, the protective circuit HK1 is arranged on the electric source lines Vss of the low electric potential side. However, the present invention is not limited to this arrangement. A protective circuit HK2, FIG. 16, can be connected to the electric source line Vdd of the high electric potential side between the analog unit and the digital unit to short-cut the electric source line Vdd. Also, as shown in FIG. 16, the protective circuit HK1 can be connected to the electric source line Vss of the low electric potential side and the protective circuit HK2 can be connected to the electric source line Vdd of the high electric potential side in the semiconductor unit.

The configuration of each of the protective circuits HK1 and HK2 is shown in FIGS. 4 to 12 in the same manner as in the first embodiment.

(3) Third Embodiment

Hereinafter, a semiconductor unit according to a third embodiment of the present invention is described with reference to drawings. The same matters as those in the first or second embodiment are omitted to avoid duplicated description.

Figure 17:
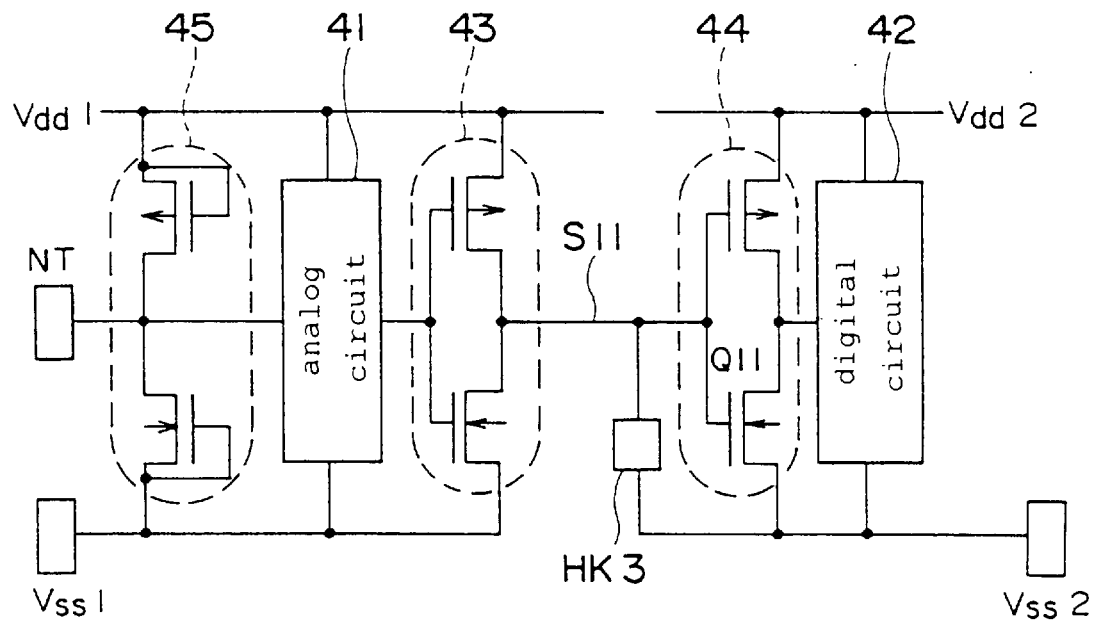
FIG. 17 is a diagram of a semiconductor unit according to a third embodiment of the present invention.

As shown in FIG. 17, a semiconductor unit according to the third embodiment comprises an analog unit and a digital unit in the same manner as the semiconductor memory. The analog unit of the semiconductor unit according to the third embodiment comprises an analog circuit 41, an output circuit 43 and an input protective circuit 45, and the digital unit of the semiconductor unit comprises a digital circuit 42 and an input circuit 44. A signal line S11 connects the output circuit 43 of the analog unit and the input circuit 44 of the digital unit.

An electric source voltage applied to the analog unit is supplied through each of electric source lines Vdd1 and Vss1, and an electric source voltage applied to the digital unit is supplied through each of electric source lines Vdd2 and Vss2. The electric source line Vdd1 is separated from the electric source line Vdd2, and the electric source line Vss1 is separated from the electric source line Vss2.

The analog unit is an example of a first circuit, and the digital unit is an example of a second circuit. Also, the electric source line Vdd1 is an example of a first electric source line of a high electric potential side, the electric source line Vss1 is an example of a first electric source line of a low electric potential side, the electric source line Vdd2 is an example of a second electric source line of a high electric potential side, and the electric source line Vss2 is an example of a second electric source line of a low electric potential side.

The semiconductor unit further comprises a protective circuit HK3 connecting the electric source line Vss2 and the signal line S11. When an electric potential difference between the electric source line Vss2 and the signal line S11 exceeds a prescribed value, the protective circuit HK3 is operated to electrically connect the electric source line Vss2 and the signal line S11, so that the protective circuit HK3 is a switching circuit for limiting the electric potential difference between the electric source line Vss2 and the signal line S11.

In the above configuration, a signal generated in the analog circuit 41 is output to the signal line S11 through the output circuit 43 and is transmitted to the digital circuit 42 through the input circuit 44 made of an inverter.

In cases where a surge is input to either an applied terminal NT used as an input terminal of the analog unit or the electric source terminal Vss1, an electric potential of the electric source terminal Vss1 is rapidly increased, and an electric potential of the signal line S11 is increased with the rapid increase of the electric potential of the electric source terminal Vss1. When an electric potential difference between the electric source line Vss1 and the signal line S11 exceeds a prescribed electric potential difference, the protective circuit HK3 is operated to electrically connect the electric source line Vss2 and the signal line S11, so that the electric source line Vss2 and the signal line S11 are set to the same electric potential.

Accordingly, there is prevented an electric potential difference between a gate and a source in a MOS transistor Q1 in the inverter of the input circuit 44 being excessively increased, so that break down of a gate oxide film of the MOS transistor Q1 can be prevented.

Figure 18:
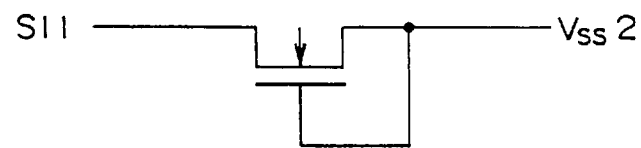
FIG. 18 is a diagram of a first type of a protective circuit (HK3) according to the third embodiment of the present invention.
Figure 19:
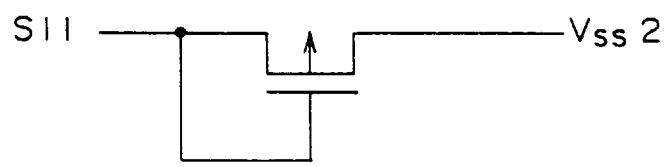
FIG. 19 is a diagram of a second type of protective circuit (HK3) according to the third embodiment of the present invention.
Figure 20:
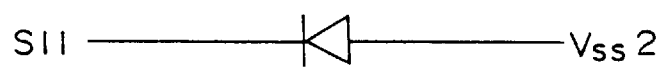
FIG. 20 is a diagram of a third type of protective circuit (HK3) according to the third embodiment of the present invention.

A plurality of examples of the protective circuit HK3 are shown in FIGS. 18 to 20. Also, the protective circuit HK3 can be made by connecting two or more examples in series or in parallel. Also, the protective circuit HK3 can be one or more bipolar transistors such as PNP type transistors or NPN transistors. In conclusion, any circuit can be used as the protective circuit HK3 on condition that one electric source line and one signal line are electrically connected to set the electric source line and the signal line to the same electric potential in cases where an electric potential difference between the electric source line and the signal line exceeds a prescribed value.

In the third embodiment, the protective circuit HK3 is arranged to electrically connect the electric source line Vss2 of the low electric potential side and the signal line S11.

Figure 21:
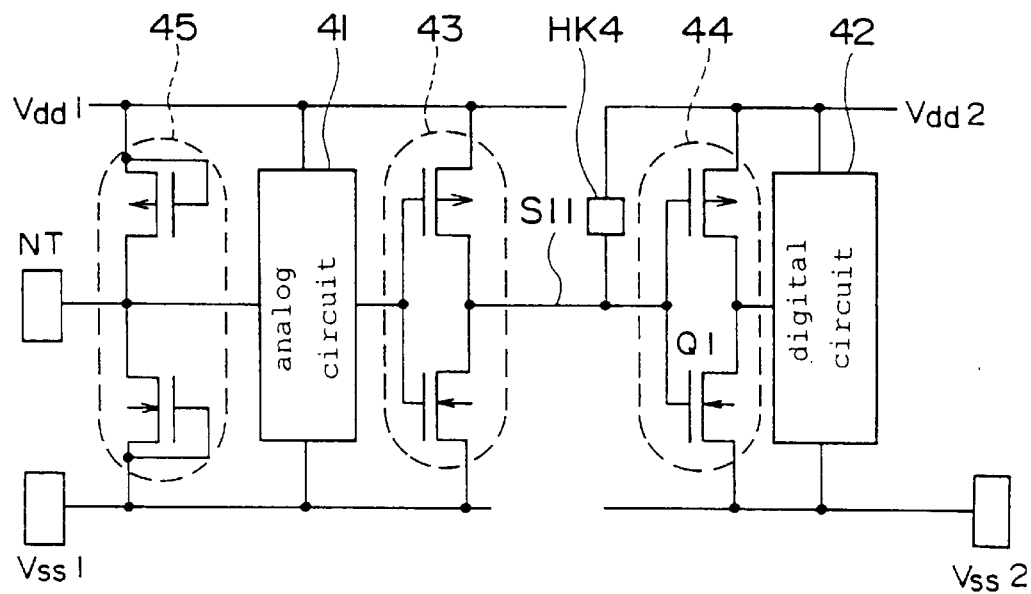
FIG. 21 is a diagram of a second variation of the semiconductor unit according to the third embodiment of the present invention.
Figure 25:
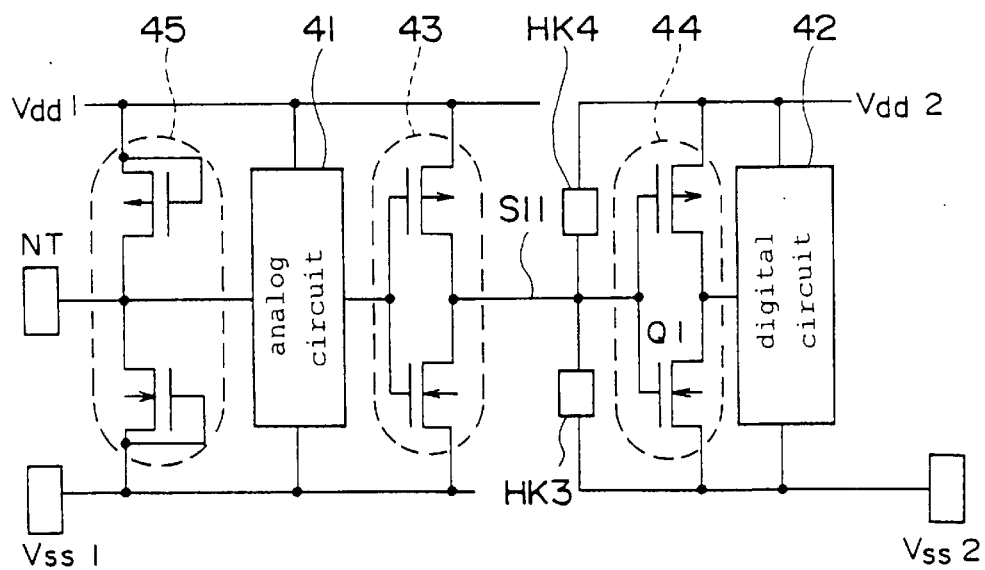
FIG. 25 is a diagram of a third variation of the semiconductor unit according to the third embodiment of the present invention.

However, the present invention is not limited to such placement of the protective circuit HK3. As shown in FIG. 21, a protective circuit HK4 can be arranged to electrically connect the electric source line Vdd2 of the high electric potential side and the signal line S11. Also, as shown in FIG. 25, the protective circuit HK3 can electrically connect the electric source line Vss2 of the low electric potential side and the signal line S11 and the protective circuit HK4 can electrically connect the electric source line Vdd2 of the high electric potential side and the signal line S11.

Figure 22:
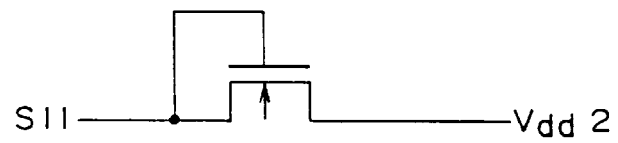
FIG. 22 is a diagram of a first type of a protective circuit (HK4) according to the third embodiment of the present invention.
Figure 23:
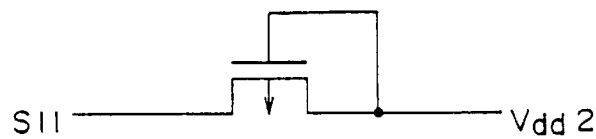
FIG. 23 is a diagram of a second type of protective circuit (HK4) according to the third embodiment of the present invention.
Figure 24:
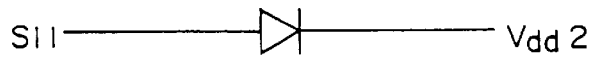
FIG. 24 is a diagram of a third type of protective circuit (HK4) according to the third embodiment of the present invention.

A plurality of examples of the protective circuit HK4 are shown in FIGS. 22 to 24. Also, the protective circuit HK4 can be made by connecting two or more examples in series or in parallel. Also, the protective circuit HK4 can be one or more bipolar transistors such as PNP type transistors or NPN transistors. In conclusion, any circuit can be used as the protective circuit HK3 on condition that one electric source line and one signal line are electrically connected to set the electric source line and the signal line to the same electric potential in cases where an electric potential difference between the electric source line and the signal line exceeds a prescribed value.

(4) Fourth Embodiment

Hereinafter, a semiconductor unit according to a fourth embodiment of the present invention is described. The same matters as those in the first, second or third embodiment are omitted to avoid duplicated description.

Figure 26:
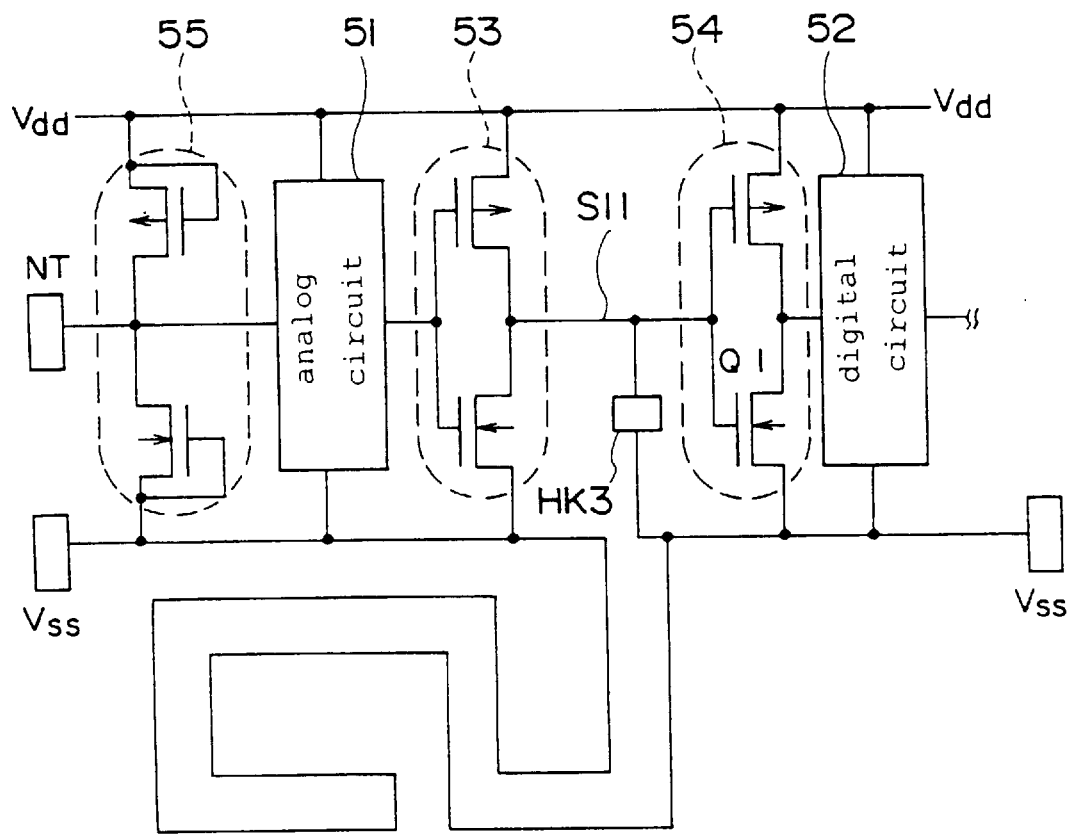
FIG. 26 is an electrical diagram of a semiconductor unit according to a fourth embodiment of the present invention.

As shown in FIG. 26, a semiconductor unit comprises an analog unit and a digital unit. The analog unit comprises an analog circuit 51, an input protective circuit 55 connected to the analog circuit 51, and an output circuit 53 connected to the analog circuit 51. The digital unit comprises a digital circuit 52 and an input circuit 54 connected to the digital circuit 52. An electric source line Vss of a low electric potential side and an electric source line Vdd of a high electric potential side are respectively connected to the circuits 51 to 55, and a signal line S11 connects the output circuit 53 and the input circuit 54. The electric source line Vss takes a long way around another section (not shown) because of a design requirement, so that the section of the electric source line Vss between the analog and digital units becomes lengthy.

The semiconductor unit further comprises the protective circuit HK3 connecting the electric source line Vss close to the digital circuit 52 and the signal line S11, in the same manner as in the third embodiment. In the above configuration, a signal generated in the analog circuit 51 is output to the signal line S11 through the output circuit 53 and is transmitted to the digital circuit 52 through the input circuit 54 made of an inverter.

In the absence of the protective circuit HK3 for the semiconductor unit when a surge voltage is input to the electric source line Vss the transmission of the surge voltage to the digital unit is delayed by the lengthy electric source line Vss, a large electric potential difference instantaneously occurs between the electric source line Vss close to the analog circuit 51 and the electric source line Vss close to the digital circuit 52, an electric potential of the signal line S11 is excessively increased, and a gate insulating film of a MOS transistor Q1 of an inverter in the input circuit 54 of the digital circuit 52 is undesirably broken down.

However in the presence of the protective circuit HK3, an electric potential difference instantaneously occurs between the portion of the electric source line Vss close to the analog circuit 51 and the signal line S11 and when the electric potential difference exceeds a prescribed electric potential difference, the protective circuit HK3 is operated to electrically connect the electric source line Vss close to the digital circuit 52 and the signal line S11, so that the portion of the electric source line Vss close to the digital circuit 52 and the signal line S11 are set to the same electric potential.

Accordingly, there is prevented an electric potential difference between a gate and a source in a MOS transistor Q1 in the inverter of the input circuit 54 being excessively increased, so that break down of a gate oxide film of the MOS transistor Q1 can be prevented.

Figure 27:
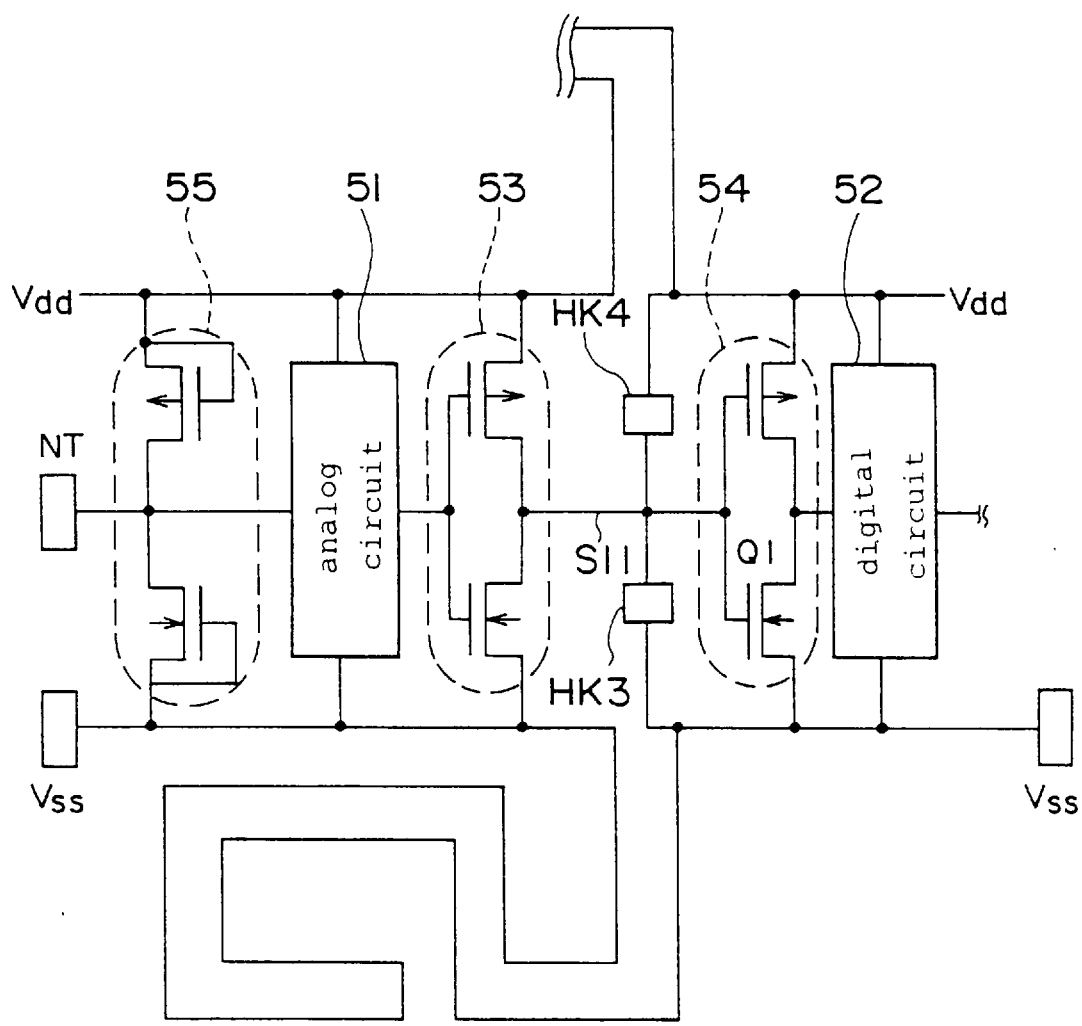
FIG. 27 is a diagram of a second variation of the semiconductor unit according to the fourth embodiment of the present invention.

In the fourth embodiment, the protective circuit HK3 is arranged to electrically connect the electric source line Vss close to the digital circuit 52 and the signal line S11. However, the present invention is not limited to such an arrangement. The protective circuit HK3 can be arranged to electrically connect the electric source line Vdd close to the digital circuit 52 and the signal line S11. Also, as shown in FIG. 27, both the protective circuit HK3 electrically connects the electric source line Vss close to the digital circuit 52 and the signal line S11 and the protective circuit HK4 electrically connects the electric source line Vdd close to the digital circuit 52 and the signal line S11 for the semiconductor unit.

(5) Fifth Embodiment

Hereinafter, a semiconductor unit according to a fifth embodiment of the present invention is described. The same matters as those in the first, second, third or fourth embodiment are omitted to avoid duplicated description.

Figure 28:
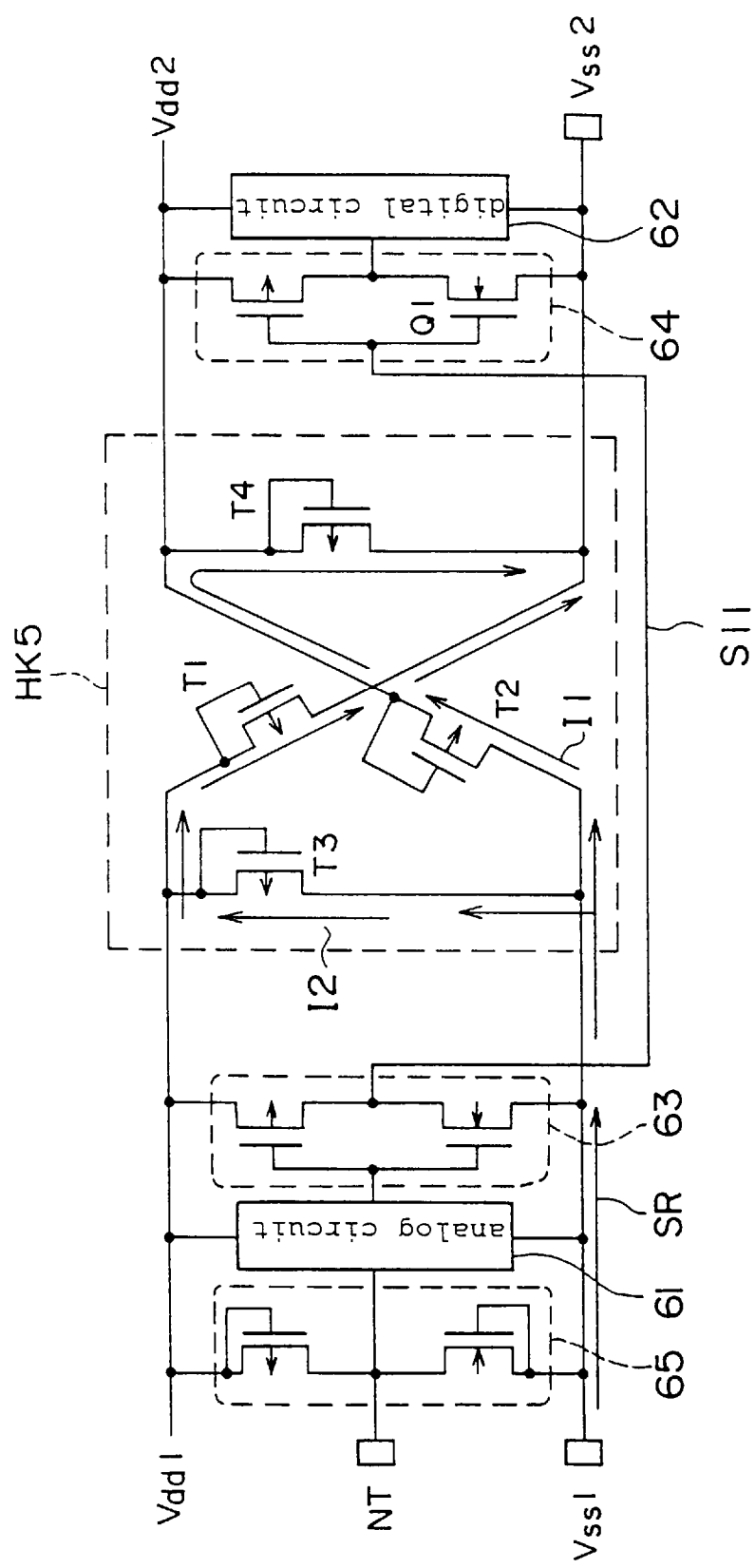
FIG. 28 is an electrical diagram of a semiconductor unit according to a fifth embodiment of the present invention.

As shown in FIG. 28, a semiconductor unit according to the fifth embodiment comprises an analog unit and a digital unit. The analog unit comprises an analog circuit 61, an input protective circuit 65 connected to the analog circuit 61, and an output circuit 63 connected to the analog circuit 61. The digital unit comprises a digital circuit 62 and an input circuit 64 connected to the digital circuit 62. A signal line S11 connects the output circuit 63 and the input circuit 64.

An electric source voltage applied to the analog unit is supplied through each of electric source lines Vdd1 and Vss1, and an electric source voltage applied to the digital unit is supplied through each of electric source lines Vdd2 and Vss2.

The analog unit is an example of a first circuit, and the digital unit is an example of a second circuit. Also, the electric source line Vdd1 is an example of a first electric source line of a high electric potential side, the electric source line Vss1 is an example of a first electric source line of a low electric potential side, the electric source line Vdd2 is an example of a second electric source line of a high electric potential side, and the electric source line Vss2 is an example of a second electric source line of a low electric potential side.

The semiconductor unit further comprises a protective circuit HK5 through which the electric source lines Vdd1, Vdd2, Vss1 and Vss2 are connected to each other. The protective circuit HK5 comprises a first p-channel MOS transistor T1 in which a drain is connected with the electric source line Vdd1, a source is connected with the electric source line Vss2 and a gate and the drain are electrically connected, a second p-channel MOS transistor T2 in which a source is connected with the electric source line Vss1, a drain is connected with the electric source line Vdd2 and a gate and the drain are electrically connected, a third p-channel MOS transistor T3 in which a drain is connected with the electric source line Vdd1, a source is connected with the electric source line Vss1 and a gate and the drain are electrically connected, and a fourth p-channel MOS transistor T4 in which a drain is connected with the electric source line Vdd2, a source is connected with the electric source line Vss2 and a gate and the drain are electrically connected. In cases where a surge current is supplied to an applied terminal NT used as an input terminal of the analog unit, a part of the surge current passes through the electric source line Vss1 and is split by the protective circuit HK5, and the part of the surge current is transmitted to the electric source line Vss2. Therefore, a current passing through the signal line S11 is reduced by the protective circuit HK5.

In the above configuration, in a normal operation, a signal generated in the analog circuit 61 is output to the signal line S11 through the output circuit 63 and is transmitted to the digital circuit 62 through the input circuit 64 made of an inverter. In this case, because the protective circuit HK5 is equivalent to a diode circuit shown in FIG. 30, the MOS transistors T1 to T4 are turned off in the normal operation, and the electric source lines Vdd1, Vdd2, Vss1 and Vss2 are electrically separated from each other. That is, the electric source lines Vdd1 and Vss2 are electrically separated from each other by the first MOS transistor T1, the electric source lines Vdd2 and Vss1 are electrically separated from each other by the second MOS transistor T2, the electric source lines Vdd1 and Vss1 are electrically separated from each other by the third MOS transistor T3, and the electric source lines Vdd2 and Vss2 are electrically separated from each other by the fourth MOS transistor T4.

However, as shown in FIG. 28, in cases where a surge current SR is supplied to the applied terminal NT or a terminal of the electric source line Vss1 in an abnormal operation, a reverse bias of a high voltage is applied to each of the first to fourth MOS transistors T1 to T4, and the first to fourth MOS transistors T1 to T4 are turned on. Therefore, a part of the surge current SR passes through a first route connecting the electric source line Vss1, the second MOS transistor T2, the electric source line Vdd2, the fourth MOS transistor T4 and the electric source line Vss2, and another part of the surge current SR passes through a second route connecting the electric source line Vss1, the third MOS transistor T3, the electric source line Vdd1, the first MOS transistor T1 and the electric source line Vss2. Accordingly, the electric source lines Vss1 and Vss2 are set to almost the same electric potential, and break down of a gate oxide film of a MOS transistor Q1 of the input circuit 64 can be prevented.

Also, in cases where a surge current SR is supplied to a terminal of the electric source line Vdd1, the electric source lines Vdd1 and Vdd2 are set to almost the same electric potential in the same manner, and break down of the gate oxide film of the MOS transistor Q1 can be prevented.

Figure 29:
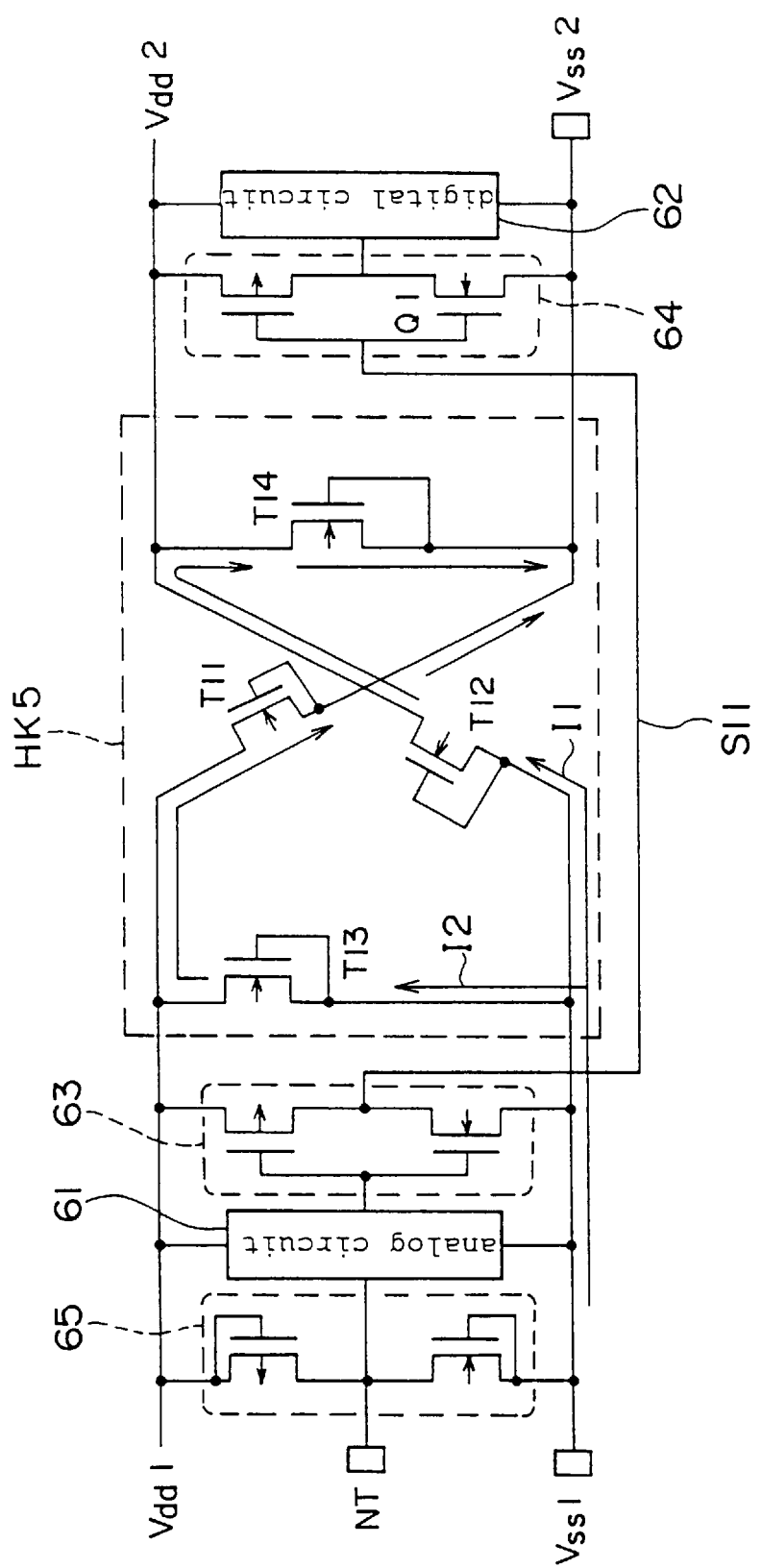
FIG. 29 is a diagram of a second variation of the semiconductor unit according to the fifth embodiment of the present invention.

In this embodiment, the p-channel MOS transistors T1 to T4 are used for the protective circuit HK5. However, as shown in FIG. 29, it is applicable that the protective circuit HK5 comprise four n-channel MOS transistors T11 to T14. In this case, gates of the n-channel MOS transistors T12 and T13 are electrically connected with the electric source line Vss1, and gates of the n-channel MOS transistors T11 and T14 are electrically connected with the electric source line Vss 2. Therefore, when a surge current SR is supplied to the applied terminal NT or a terminal of the electric source line Vss1, a part of the surge current SR passes through a first route connecting the electric source line Vss1, the MOS transistor T12 the electric source line Vdd2, the MOS transistor T14 and the electric source line Vss2, and another part of the surge current SR passes through second route connecting the electric source line Vss1, the MOS transistor T13, the electric source line Vdd1, the MOS transistor T11 and the electric source line Vss2. Accordingly, the electric source lines Vss1 and Vss2 are set to almost the same electric potential, and break down of the gate oxide film of the MOS transistor Q1 can be prevented.

Also, even though the third MOS transistor T3 (or T13) or the fourth MOS transistor T4 (or T14) is omitted, break down of the gate oxide film of the MOS transistor Q1 can be prevented.

Figure 30:
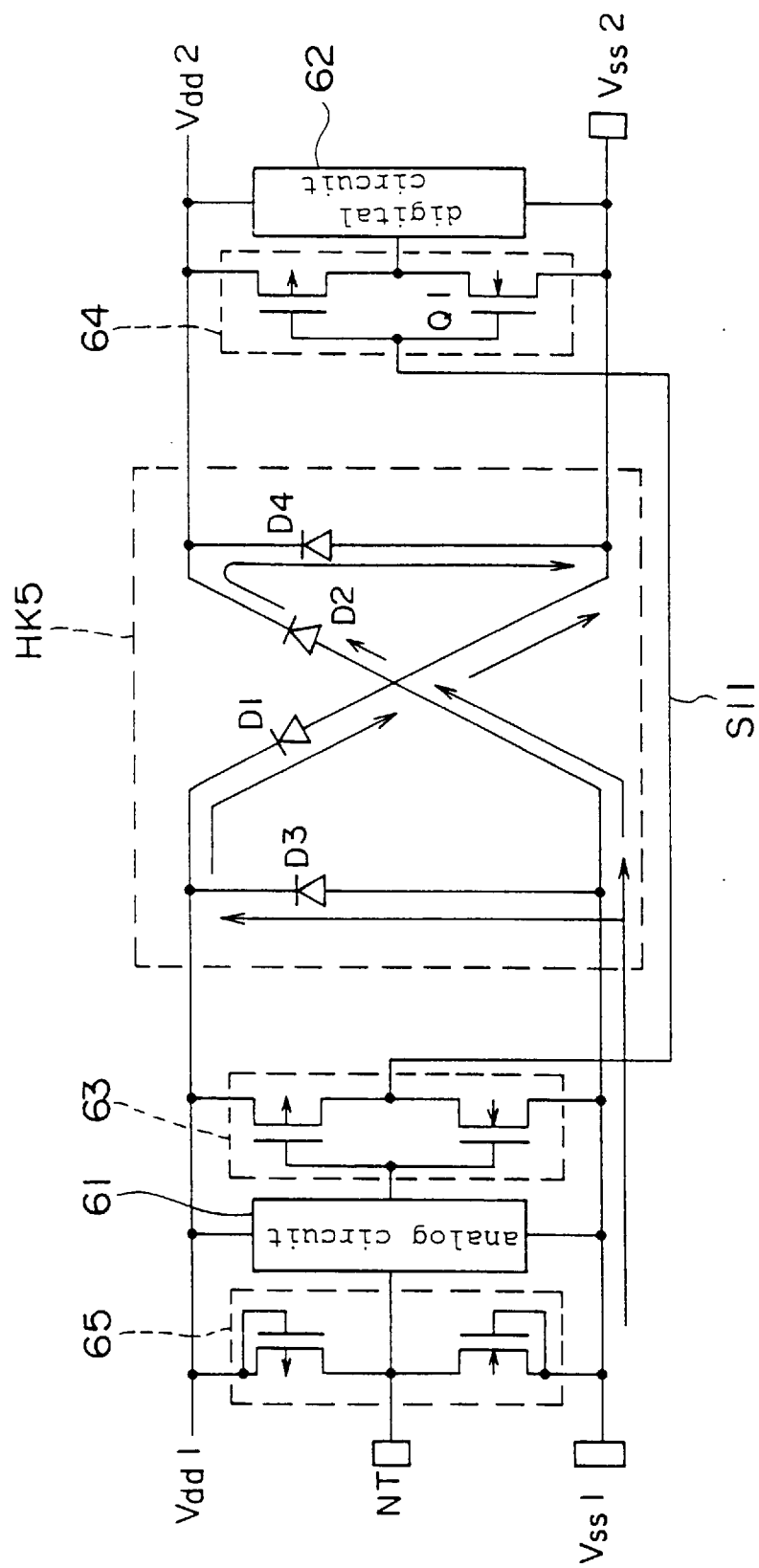
FIG. 30 is a diagram of a third variation of the semiconductor unit according to the fifth embodiment of the present invention.

Also, as shown in FIG. 30, it is applicable that the diodes D1 to D4 be used in place of the MOS transistors T1 to T4 (or T11 to T14). That is, a cathode of the diode D1 is connected with the electric source line Vdd1, an anode of the diode D1 is connected with the electric source line Vss2, a cathode of the diode D2 is connected with the electric source line Vdd2, an anode of the diode D2 is connected with the electric source line Vss1, a cathode of the diode D3 is connected with the electric source line Vdd1, an anode of the diode D3 is connected with the electric source line Vss1, a cathode of the diode D4 is connected with the electric source line Vss2, and an anode of the diode D4 is connected with the electric source line Vdd2.

What is claimed is:

1. A semiconductor unit, comprising:
a first circuit;
a second circuit;
a first electric source line of a low electric potential side through which a first low electric potential is applied to the first circuit;
a first electric source line of a high electric potential side through which a first high electric potential is applied to the first circuit;
a second electric source line of a low electric potential side through which a second low electric potential is applied to the second circuit;
a second electric source line of a high electric potential side through which a second high electric potential is applied to the second circuit;
said first electric source lines being normally isolated from said second electric source lines;
a signal line connecting an output of the first circuit to an input of the second circuit to transmit a signal from the first circuit to the second circuit; and
a protective circuit, connected between the first electric source line of the low electric potential side or the high electric potential side and the second electric source line of the low electric potential side or the high electric potential side, for electrically connecting the first electric source line of the low electric potential side or the high electric potential side and the second electric source line of the low electric potential side or the high electric potential side in cases where an electric potential difference between an electric potential of the first electric source line of the low electric potential side or of the high electrical potential side and the second electric source line of the low electric potential side or the high electric potential side exceeds a prescribed value so as to protect against failure of the second circuit due to the output of the first circuit producing said excessive electric potential difference.

2. A semiconductor unit according to claim 1 in which a gate of a MOS transistor in an input or output circuit of the second circuit is connected to the signal line, and a source or a drain of the MOS transistor is connected to the second electric source line of the low electric potential side or the second electric source line of the high electric potential side.

3. A semiconductor unit according to claim 1 in which the protective circuit comprises a group of one or more MOS transistors, a group of one or more diodes, or a group of one or more bipolar transistors.

4. A semiconductor unit according to claim 1 in which the protective circuit comprises:
a first protective circuit, arranged between the first electric source line of the high electric potential side and the second electric source line of the high electric potential side, for electrically connecting the first electric source line of the high electric potential side and the second electric source line of the high electric potential side in cases where an electric potential difference between the first electric source line of the high electric potential side and the second electric source line of the high electric potential side exceeds a first prescribed value; and
a second protective circuit, arranged between the first electric source line of the low electric potential side and the second electric source line of the low electric potential side, for electrically connecting the first electric source line of the low electric potential side and the second electric source line of the low electric potential side in cases where an electric potential difference between the first electric source line of the low electric potential side and the second electric source line of the low electric potential side exceeds a second prescribed value.

5. A semiconductor unit, comprising:
a first circuit;
a second circuit;
a first electric source line of a low electric potential side through which a low electric potential is applied to the first circuit and the second circuit;
a second electric source line of a high electric potential side through which a high electric potential is applied to the first circuit and the second circuit;
one of said first and second electrical source lines having a lengthy portion between said first and second circuits wherein an excessive electric potential can be generated across said lengthy portion;
a signal line, connecting the first circuit and the second circuit, through which a signal is transmitted between the first circuit and the second circuit; and
a protective circuit for electrically connecting the one electric source line close to the first circuit and the one electric source line close to the second circuit so as to short cut said lengthy portion when an electric potential across said lengthy portion exceeds a prescribed value.

6. A semiconductor unit according to claim 5 in which a gate of a MOS transistor in an input or output circuit of the second circuit is connected to the signal line, and a source or a drain of the MOS transistor is connected to the second electric source line of the low electric potential side or the second electric source line of the high electric potential side.

7. A semiconductor unit according to claim 5 in which the protective circuit comprises a group of one or more MOS transistors, a group of one or more diodes, or a group of one or more bipolar transistors.

8. A semiconductor unit, comprising:
a first circuit;
a second circuit;
a first electric source line of a low electric potential side through which a first low electric potential is applied to the first circuit;
a first electric source line of a high electric potential side through which a first high electric potential is applied to the first circuit;
a second electric source line of a low electric potential side through which a second low electric potential is applied to the second circuit;
a second electric source line of a high electric potential side through which a second high electric potential is applied to the second circuit;
said first electric source lines being normally isolated from said second electric source lines;
a signal line connecting an output of the first circuit to an input of the second circuit to transmit a signal from the first circuit to the second circuit; and
a protective circuit, connected between the signal line and the second electric source line of the low electric potential side or the high electric potential side, for electrically connecting the signal line and the second electric source line of the low electric potential side or the high electric potential side in cases where an electric potential difference between an electric potential of the signal line and an electric potential of the second electric source line of the low electric potential side or the high electric potential side exceeds a prescribed value so as to protect against failure of the second circuit due to the output of the first circuit producing said excessive electric potential difference.

9. A semiconductor unit according to claim 8 in which the protective circuit comprises:
a first protective circuit, arranged between the signal line and the second electric source line of the high electric potential side, for electrically connecting the signal line and the second electric source line of the high electric potential side in cases where an electric potential difference between the signal line and the second electric source line of the high electric potential side exceeds a first prescribed value; and
a second protective circuit, arranged between the signal line and the second electric source line of the low electric potential side, for electrically connecting the signal line and the second electric source line of the low electric potential side in cases where an electric potential difference between the signal line and the second electric source line of the low electric potential side exceeds a second prescribed value.

10. A semiconductor unit according to claim 8 in which a gate of a MOS transistor composing an input or output circuit of the second circuit is connected to the signal line, and a source or a drain of the MOS transistor is connected to the second electric source line of the low electric potential side or the second electric source line of the high electric potential side.

11. A semiconductor unit according to claim 8 in which the protective circuit comprises a group of one or more MOS transistors, a group of one or more diodes, or a group of one or more bipolar transistors.

12. A semiconductor unit, comprising:
a first circuit;
a second circuit;
a first electric source line of a low electric potential side through which a low electric potential is applied to the first circuit and the second circuit;
a second electric source line of a high electric potential side through which a high electric potential is applied to the first circuit and the second circuit;
one of said first and second electrical source lines having a lengthy portion between said first and second circuits wherein an excessive electric potential can be generated across said lengthy portion;
a signal line, connecting the first circuit and the second circuit, through which a signal is transmitted between the first circuit and the second circuit; and a protective circuit for electrically connecting the signal line and the first electric source line close to the second circuit or the second electric source line close to the second circuit in cases where an electric potential differences between an electric potential of the signal line and an electric potential of the first electric source line close to the second circuit or the second electric source line close to the second circuit exceeds a prescribed value.

13. A semiconductor unit according to claim 12 in which a gate of a MOS transistor composing an input or output circuit of the second circuit is connected to the signal line, and a source or a drain of the MOS transistor is connected to the second electric source line of the low electric potential side or the second electric source line of the high electric potential side.

14. A semiconductor unit according to claim 12 in which the protective circuit comprises a group of one or more MOS transistors, a group of one or more diodes, or a group of one or more bipolar transistors.

15. A semiconductor unit, comprising:

a first circuit;

a second circuit;

a first electric source line of a low electric potential side through which a first low electric potential is applied to the first circuit;

a first electric source line of a high electric potential side through which a first high electric potential is applied to the first circuit;

a second electric source line of a low electric potential side through which a second low electric potential is applied to the second circuit;

a second electric source line of a high electric potential side through which a second high electric potential is applied to the second circuit;

a signal line, connecting the first circuit and the second circuit, through which a signal is transmitted between the first circuit and the second circuit; and a protective circuit, connected from the first electric source lines of the low and high electric potential sides to the second electric source lines of the low and high electric potential sides, for reducing an abnormal current which is excessive as compared with a normal current in a normal operation and passes through the signal line in cases where the abnormal current is induced to pass through the signal line in an abnormal operation.

16. A semiconductor unit according to claim 15 in which the protective circuit comprises:

a first p-channel MOS transistor in which a drain or a source is connected with the first electric source line of the high electric potential side, the source or the drain is connected with the second electric source line of the low electric potential side, and a gate is electrically connected with the drain or the source;

a second p-channel MOS transistor in which a source or a drain is connected with the first electric source line of the low electric potential side, the drain or the source is connected with the second electric source line of the high electric potential side, and a gate is electrically connected with the drain or the source;

a third p-channel MOS transistor in which a drain or a source is connected with the first electric source line of the high electric potential side, the source or the drain is connected with the first electric source line of the low electric potential side, and a gate is electrically connected with the drain or the source; and a fourth p-channel MOS transistor in which a drain or a source is connected with the second electric source line of the high electric potential side, the source or the drain is connected with the second electric source line of the low electric potential side, and a gate is electrically connected with the drain or the source.

17. A semiconductor unit according to claim 15 in which the protective circuit comprises:

a first n-channel MOS transistor in which a drain or a source is connected with the first electric source line of the high electric potential side, the source or the drain is connected with the second electric source line of the low electric potential side, and a gate is electrically connected with the source or the drain;

a second n-channel MOS transistor in which a source or a drain is connected with the first electric source line of the low electric potential side, the drain or the source is connected with the second electric source line of the high electric potential side, and a gate is electrically connected with the source or the drain;

a third n-channel MOS transistor in which a drain or a source is connected with the first electric source line of the high electric potential side, the source or the drain is connected with the first electric source line of the low electric potential side, and a gate is electrically connected with the source or the drain; and a fourth n-channel MOS transistor in which a drain or a source is connected with the second electric source line of the high electric potential side, the source or the drain is connected with the second electric source line of the low electric potential side, and a gate is electrically connected with the source or the drain.

18. A semiconductor unit according to claim 15 in which the protective circuit comprises:

a first diode in which a cathode is connected with the first electric source line of the high electric potential side and the anode is connected with the second electric source line of the low electric potential side;

a second diode in which an anode is connected with the first electric source line of the low electric potential side and the cathode is connected with the second electric source line of the high electric potential side;

a third diode in which a cathode is connected with the first electric source line of the high electric potential side and the anode is connected with the first electric source line of the low electric potential side; and a fourth diode in which a cathode is connected with the second electric source line of the high electric potential side and the anode is connected with the second electric source line of the low electric potential side.

19. A semiconductor unit according to claim 15 in which a gate of a MOS transistor in an input or output circuit of the second circuit is connected to the signal line, and a source or a drain of the MOS transistor is connected to the second electric source line of the low electric potential side or the second electric source line of the high electric potential side.

20. A semiconductor unit, comprising:

a first circuit;

a second circuit;

a first electric source line of a low electric potential side through which a first low electric potential is applied to the first circuit;

a first electric source line of a high electric potential side through which a first high electric potential is applied to the first circuit;

a second electric source line of a low electric potential side through which a second low electric potential is applied to the second circuit;

a second electric source line of a high electric potential side through which a second high electric potential is applied to the second circuit;

said first electric source lines being normally isolated from said second electric source lines;

a signal line connecting an output of the first circuit to an input of the second circuit to transmit a signal from the first circuit to the second circuit; and a protective circuit, connected between the first electric source line of the low electric potential side and the second electric source line of the low electric potential side or connected between the first electric source line of the high electric potential side and the second electric source line of the high electric potential side, for electrically connecting the first electric source line of the low electric potential side to second electric source line of the low electric potential side or for electrically connecting the first electric source line of the high electric potential side to the second electric source line of the high electric potential side in cases where an electric potential difference between an electric potential of the first electric source line of the low electric potential side and an electric potential of the second electric source line of the low electric potential side or between an electric potential of the first electric source line of the high electric potential side and an electric potential of the second electric source line of the high electric potential side exceeds a prescribed value.

21. A semiconductor unit as claimed in claim 20 wherein the protective circuit is connected between the first electric source line of the low electric potential side and the second electric source line of the low electric potential side for electrically connecting the first electric source line of the low electric potential side to second electric source line of the low electric potential side when an electric potential difference between an electric potential of the first electric source line of the low electric potential side and an electric potential of the second electric source line of the low electric potential side exceeds a prescribed value.

22. A semiconductor unit as claimed in claim 1 wherein
the first circuit includes an input terminal and a second protective circuit connected to the input terminal, the first electric source line of the high electric potential side and the first electric source line of the low electric potential side; and said first protective circuit protects against surges passing through said second protective circuit and to the output of the first circuit.

23. A semiconductor unit as claimed in claim 8 wherein
the first circuit includes an input terminal and a second protective circuit connected to the input terminal, the first electric source line of the high electric potential side and the first electric source line of the low electric potential side; and said first protective circuit protects against surges passing through said second protective circuit and to the output of the first circuit.

24. A semiconductor unit as claimed in claim 20 wherein
the first circuit includes an input terminal and a second protective circuit connected to the input terminal, the first electric source line of the high electric potential side and the first electric source line of the low electric potential side; and said first protective circuit protects against surges passing through said second protective circuit and to the output of the first circuit.

* * * * *